United States Patent [19]

Steckler

[11] E Re. 30,572

[45] Reissued Apr. 7, 1981

[54] LOW DISTORTION SIGNAL AMPLIFIER ARRANGEMENT

[75] Inventor: Steven A. Steckler, Clark, N.J.

[73] Assignee: RCA Corporation, New York, N.Y.

[21] Appl. No.: 23,952

[22] Filed: Mar. 26, 1979

Related U.S. Patent Documents

Reissue of:

[64] Patent No.: 4,081,758
Issued: Mar. 28, 1978
Appl. No.: 690,721
Filed: May 27, 1976

[51] Int. Cl.[3] ..... H03F 3/45
[52] U.S. Cl. ..... 330/252; 330/261
[58] Field of Search ..... 330/69, 149, 252, 261

[56] References Cited

U.S. PATENT DOCUMENTS

| | | | |
|---|---|---|---|
| 3,641,450 | 2/1972 | Lunn | 330/254 |
| 3,848,139 | 11/1974 | Holt, Jr. | 330/257 X |
| 3,916,333 | 10/1975 | Zuk | 330/259 |

OTHER PUBLICATIONS

Steckler, "Low Distortion Current Splitter/Attenuator", *RCA Technical Notes*, TN No. 965, Jul. 2, 1974.

*Primary Examiner*—James B. Mullins
*Attorney, Agent, or Firm*—E. M. Whitacre; P. J. Rasmussen; P. M. Emanuel

[57] ABSTRACT

A signal amplifier arrangement comprises first and second differential amplifiers coupled in common to a current source which supplies all of the current to the amplifier circuits. Signals to be amplified are coupled between the control electrodes (bases) of the devices in each of the differential circuits by means of voltage follower stages. The main conduction path (collector-emitter) of each of the followers is coupled in series with the main conduction path of the device in the first differential circuit other than the one to the control electrode of which the follower output is coupled. Output signal current is produced in one or more load circuits connected to the second differential circuit, the output signal current being related to the differential input signal voltage but substantially independent of current level induced base-emitter voltage variations in the differential amplifier devices.

11 Claims, 1 Drawing Figure

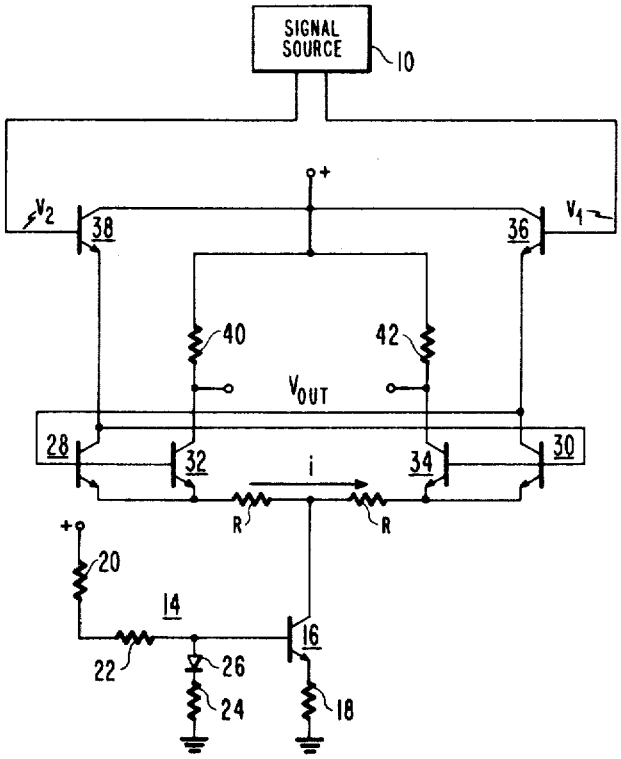
SIGNAL SOURCE
10
+
$V_2$
38
36
$V_1$
40
42
$V_{OUT}$
28
32
i
34
30
R
R
+
20
14
16
22
26
24
18

LOW DISTORTION SIGNAL AMPLIFIER ARRANGEMENT

Matter enclosed in heavy brackets [ ] appears in the original patent but forms no part of this reissue specification; matter printed in italics indicates the additions made by reissue.

This invention relates to semiconductor differential signal processing circuits and, more particularly, to arrangements for cancelling the effect of distortion-producing, non-linear base-emitter voltage characteristics in such differential circuits.

Transistor differential amplifier arrangements including three (or more) active devices are commonly employed in monolithic integrated circuits as well as discrete device circuits. Such differential amplifiers are particularly suitable for construction in integrated circuit form where the characteristics of the differentially coupled transistors are readily matched one to another.

As was pointed out in the publication "RCA Linear Integrated Circuit Fundamentals", Technical Series IC-40, published by RCA Corporation, transistor differential amplifiers exhibit a transfer characteristic including a distortion or offset term dependent upon the base-emitter voltage ($V_{be}$) of the transistors. This offset voltage is, in turn, variably dependent upon several factors including temperature, $\beta$ of the transistors and various base and emitter resistor values and ratios. When low distortion is a requirement, differential amplifiers typically are degenerated with emitter resistors that are large compared to the junction impedances of the devices, or by some other equivalent means such as reducing the direct current bias. Degeneration has the undesired effect of reducing the signal gain of the stage. The present invention permits the use of emitter degenerating resistors but their values may be significantly lower for a given amount of output distortion.

In accordance with the present invention, a signal amplifier arrangement comprises first and second differential amplifiers coupled in common to a direct current source which supplies all of the current to the differential circuits. Signals to be amplified are coupled between the control electrodes (bases) of the devices in each of the differential circuits by means of voltage follower stages. The main conduction path (collector-emitter) of each of the followers is coupled in series with the main conduction path of the device in the first differential circuit other than the one to the control electrode of which the follower output is coupled. Output signal current is produced in at least one load circuit connected to the second differential circuit, the output signal current being related to the differential input signal voltage but substantially independent of current level induced base-emitter voltage variations in the differential amplifier devices.

Referring to the single FIGURE of the drawing, operating bias is supplied to a current source (or sink) transistor 16 by means of a biasing network 14. Specifically, the quiescent operating current of transistor 16 is fixed by the combination of an emitter degeneration resistor 18 and a series circuit including first, second and third resistors 20, 22, 24 and a diode 26 coupled across a source of direct voltage (+). Current source transistor 16 provides operating current to a first or input pair of differentially coupled transistors 28, 30 and to a second or output pair of differentially coupled transistors 32, 34. Signal voltages ($V_1$, $V_2$) are supplied from a signal source 10 to the base (control) electrodes of voltage follower transistors 36 and 38. The emitter (output) of follower transistor 36 is direct coupled to the joined bases of transistors 28 and 32 to apply signal voltage thereto while the emitter of follower transistor 38 is similarly coupled to the joined bases of transistors 30, 34 to apply signal voltage thereto.

In accordance with the present invention, the emitter-collector or main current conduction path of follower transistor 38 is direct current coupled to the emitter-collector or main current conduction path of input differential transistor 28 while the emitter-collector or main current conduction path of follower transistor 36 is direct current coupled to the emitter-collector or main current conduction path of input differential transistor 30.

Output or load circuits illustrated as resistors 40 and 42 are coupled, respectively, to the collectors of output transistors 32 and 34.

The operation of the illustrated configuration will be described by first considering only the three transistors 16, 32, 34 as a simple differential amplifier. In that case, the differential emitter current in the transistors (i.e., the voltages at the emitters of transistors 32 and 34 divided by the sum of the resistors R) may be related to the input signal voltages $V_1$ and $V_2$ in the following manner.

$$V_{e32}=V_1-(KT/q)\ \ln\ (i_{e32}/i_s)$$

and $$V_{e34}=V_2-(KT/q)\ \ln\ (i_{e34}/i_s)$$

where:

$i_s$=saturation current of each transistor;

q=the charge on an electron;

K=Boltzman's constant; and

T=absolute temperature in degrees Kelvin.

Then, $$V_{e32}-V_{e34}=V_1-V_2+KT/q\ (\ln\ i_{e34}/i_{e32}).$$

It can therefore be seen that the differential signal current ($V_{e32}-V_{e34}/2R$) will include not only a term dependent upon the applied differential signal voltage ($V_1-V_2$) but also includes a non-linear distortion term dependent upon emitter current levels.

This effect may be negated by combining with the input signal voltage a compensating voltage which will cancel the distortion term. This compensating voltage is provided in the illustrated configuration in the following manner.

The signal voltages $V_1$ and $V_2$ are applied to the differential transistors 32, 34 via follower transistors 36 and 38, respectively. The base-emitter voltages of follower transistors 36, 38 therefore subtract from the signal voltages $V_1$, $V_2$. In that case, the voltage at the emitters of transistors 28 and 32 may be expressed as follows:

$$V_{e28}=V_1-V_{be36}-V_{be28}=V_{e32}.$$

Similarly, the voltage at the emitters of transistors 30 and 34 may be expressed as follows:

$$V_{e30}=V_2-V_{be38}-V_{be30}=V_{e34}.$$

Assuming that the current gain of each of the transistors is sufficiently high so that base current of a device is negligible compared to collector (or emitter current), it can be seen that the collector currents of series connected transistors 28 and 38 are substantially equal and the collector currents of series connected transistors 36 and 30 are substantially equal. Furthermore, if transistors 28 and 38 are of equal geometry, their base-emitter voltages will be substantially equal ($V_{be28}=V_{be38}$). Similarly, with transistors 30 and 36 of equal geometry, their base-emitter voltages will also be substantially equal ($V_{be30}=V_{be36}$).

The differential emitter voltage ($V_{e28}-V_{e30}$) may be expressed as follows:

$$V_{e28}-V_{e30}=V_1-V_{be36}-V_{be28}-V_2+V_{be38}+V_{be30}.$$

Substituting for $V_{be36}$ and $V_{be38}$ from above, $$V_{e28}-V_{e30}=V_1-V_{be30}-V_{be28}-V_2+V_{be28}+V_{be30}$$

$$V_{e28}-V_{e30}=V_1-V_2.$$

Thus, the $V_{be}$ terms (which include the undesired, logarithmic, current dependent distortion terms) are cancelled.

A differential signal current (i) between the emitters of transistors 28 and 30 therefore may be expressed as follows:

$$i=(V_1-V_2)/2R$$

Where output transistors 32 and 34 have geometries which are matched to transistors 28 and 30, differential signal currents (+i and −i) will be produced in the collectors of transistors 32 and 34. It can be seen from the last expression that such signal currents will be free of non-linear current level development $V_{be}$ distortion producing terms.

What is claimed is:

1. A signal amplifier arrangement comprising:

a first circuit path for providing a direct operating current;

a first differential amplifier circuit comprising first and second semiconductor devices, each having a main current conduction path coupled to said first direct current circuit path and each having a control electrode;

an output differential amplifier circuit comprising third and fourth semiconductor devices, each having a main current conduction path coupled to said first direct current circuit path and each having a control electrode direct current coupled respectively to control electrodes of said first and second devices;

at least a first output load circuit coupled to a main current conduction path of one of said third and fourth devices at a point remote from said coupling to said first direct current providing circuit path;

a source of signals to be amplified;

means comprising fifth and sixth semiconductor devices having main current conduction paths coupled respectively to said main current conduction paths of said second and first devices, having conduction characteristics substantially equal to conduction characteristics of said first and second devices and each having a control electrode coupled to said source of signals for coupling signal voltages between said control electrodes of said first and second devices and between said control electrodes of said third and fourth devices; whereby output signal current produced in said load circuit is related to said signals and substantially independent of current level induced variations in characteristics of said devices to which said signal voltages are coupled.

2. An arrangement according to claim 1 wherein:

said first, second, fifth and sixth devices are like conductivity transistors, said control electrodes are base electrodes and said main conduction paths are between respective collector and emitter electrodes; and said fifth and sixth transistors are coupled in emitter follower configuration with respect to said signals to be amplified.

3. An arrangement according to claim 2 wherein:

said collector-emitter paths of said first and sixth transistors are coupled in series combination and said collector emitter paths of said second and fifth transistors are coupled in series combination.

4. An arrangement according to claim 3 wherein:

said transistors in each said series combination carry like quiescent currents and thereby have like base-emitter offset voltages.

5. An arrangement according to claim 4 wherein:

output voltage across said output load circuit is substantially free of base-emitter offset voltage distortion effects.

6. An arrangement according to claim 5 and further comprising:

a second output load circuit coupled to a main current conduction path of the other of said third and fourth devices, whereby output voltage across said second load circuit is substantially free of base-emitter offset voltage distortion effects.

*7. In a signal amplifier arrangement having*

*first and second transistors of a like conductivity type having respective base and emitter and collector electrodes and having respective base-emitter junctions;*

*means for applying current to an interconnection between the emitter electrodes of said first and second transistors of a polarity tending to forward bias their respective base-emitter junctions;*

*means for applying operating potentials to the collector electrodes of said first and second transistors;*

*means responsive to the collector current of said first transistor for supplying an output signal;*

*first conductive means for providing between first and second points a conductance related to at least a portion of the conductance of said first transistor base-emitter junction;*

*second conductive means for providing between third and fourth points a conductance related to at least a portion of the conductance of said second transistor base-emitter junction;*

*means for causing a current proportionally related to the emitter current of said second transistor to flow through said first conductive means to develop a potential drop thereacross;*

*means for causing a current proportionally related to the emitter current of said first transistor to flow through said second conductance means to develop a potential drop thereacross;*

*means offsetting the base potential of said first transistor from a first input voltage in an amount proportional to*

*the potential drop across said first conductive means for suppressing distortion terms in said output signal; and*

*means offsetting the base potential of said second transistor from a second input voltage in an amount proportional to the potential drop across said first conductive means for suppressing distortion terms in said output signal the improvement wherein:*

*said first and second input voltages are respectively applied at said first point and at said third point;*

*said second point is at the base electrode of said first transistor;*

*said fourth point is at the base electrode of said second transistor;*

*said means for causing a current proportionally related to the emitter current of said first transistor to flow through said second conductive means comprises a third transistor of said like conductivity type having a base electrode to which is applied a base potential equal to the base potential at the base electrode of said first transistor, having an emitter electrode to which is applied an emitter potential equal to the emitter potential at the emitter electrode of said first transistor, and having a collector electrode connected to said fourth point; and*

*said means for causing a current proportionally related to the emitter current of said second transistor to flow through said first conductive means comprises a fourth transistor of said like conductivity type having a base electrode to which is applied a base potential equal to the base potential at the base electrode of said second transistor, having an emitter electrode to which is applied an emitter potential equal to the emitter potential at the emitter electrode of said second transistor, and having a collector electrode connected to said second point.*

*8. An improved signal amplifier arrangement as set forth in claim 7 wherein the base electrodes of said third and fourth transistors are connected at said second point and at said fourth point, respectively.*

*9. An improved signal amplifier arrangement as set forth in claim 8 wherein the emitter electrodes of said third and fourth transistors are connected to said interconnection between the emitter electrodes of said first and second transistors.*

*10. An improved signal amplifier arrangement as set forth in claim 8 wherein the emitter electrode of said third transistor connects to the emitter electrode of said first transistor and the emitter electrode of said fourth transistor connects to the emitter electrode of said second transistor.*

*11. A signal amplifier arrangement comprising:*

*a first circuit path for providing a direct operating current to a first node;*

*first, second, third and fourth transistors of like conductivity type, each having respective base and emitter and collector electrodes;*

*means for applying at the base electrodes of said first input and third transistors a first signal potential, the quiescent value of which is offset from a bias potential by a first offset potential;*

*means for applying at the base electrodes of said second input and fourth transistors a second signal potential, the quiescent value of which is offset from a bias potential by a second offset potential;*

*first conductive means for connecting said first node to a second node at the emitter electrodes of said first and third transistors for completing the base-emitter circuits of said first and third transistors, which base-emitter circuits exhibit respective potential drops across them, each potential drop having respective linear and non-linear components;*

*second conductive means for connecting said first node to a third node at the emitter electrodes of said second and fourth transistors for completing the base-emitter circuits of said second and fourth transistors, which base-emitter circuits exhibit respective potential drops across them, each potential drop having respective linear and non-linear components;*

*means connected to the collector electrodes of said first and second transistors for completing their connection in a first differential amplifier circuit;*

*means connected to the collector electrodes of said third and fourth transistors for completing their connection in a second, output differential amplifier circuit including a first output load circuit coupled to the collector electrode of one of said third and fourth transistors; and*

*means for suppressing the component of response, in the collector currents of said third and fourth transistors, to said input signal potentials which is attributable to undesired potential drop components across the base-emitter circuits of said first, second, third and fourth transistors, which means includes*

*a first current conductive element connected for conducting the collector current of said second transistor for developing a potential drop thereacross providing said first offset potential, the conductance of said first current conductive element being such that said first offset potential has a value for substantially cancelling the effect of an undesired component of the potential drops across the base-emitter circuits of said first and third transistors; and*

*a second current conductive element connected for conducting the collector current of said first transistor for developing a potential drop thereacross providing said second offset potential, the conductance of said second current conductive element being such that said second offset potential has a value for substantially cancelling the effect of an undesired component of the potential drops across the base-emitter circuits of said second and fourth transistors.*

* * * * *